(12) United States Patent
Holden et al.

(10) Patent No.: US 6,999,334 B2
(45) Date of Patent: *Feb. 14, 2006

(54) SYSTEM AND METHOD FOR DETERMINING THE LOGIC STATE OF A MEMORY CELL IN A MAGNETIC TUNNEL JUNCTION MEMORY DEVICE

(75) Inventors: Anthony Holden, Boise, ID (US); Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 166 days.

This patent is subject to a terminal disclaimer.

(21) Appl. No.: 10/660,831

(22) Filed: Sep. 12, 2003

(65) Prior Publication Data

US 2005/0099855 A1 May 12, 2005

Related U.S. Application Data

(63) Continuation of application No. 10/055,299, filed on Jan. 23, 2002, now Pat. No. 6,650,562.

(51) Int. Cl.
  *G11C 17/02* (2006.01)
(52) U.S. Cl. .................. 365/97; 365/210; 365/209; 365/207
(58) Field of Classification Search .................. 365/97, 365/210, 209, 207
  See application file for complete search history.

(56) References Cited

U.S. PATENT DOCUMENTS 6,590,804 B1 * 7/2003 Perner ........................ 365/158
6,639,839 B1 * 10/2003 Chou et al. ............. 365/185.25
6,650,562 B1 * 11/2003 Holden et al. ................. 365/97
6,674,679 B1 * 1/2004 Perner et al. ................ 365/209

OTHER PUBLICATIONS

U.S. Appl. No. 10/609,278, filed Jun. 2003, Perner.*

* cited by examiner

*Primary Examiner*—Connie C. Yoha

(57) ABSTRACT

A system and method for determining the logic state of a memory cell in a magnetic tunnel junction (MTJ) memory device based on the ratio of the current through the cell at different bias points are disclosed. A memory cell in an MJT memory device is sequentially subjected to at least two different bias voltages. The current through the cell at each of the bias voltages is measured, and a ratio of the different currents is determined. The ratio is then compared with a predetermined value to determine the logic state of the cell. The predetermined value can be a known value. Alternatively, the predetermined value can be determined by application of the system and method to a reference cell having a known logic state.

17 Claims, 9 Drawing Sheets

SYSTEM AND METHOD FOR DETERMINING THE LOGIC STATE OF A MEMORY CELL IN A MAGNETIC TUNNEL JUNCTION MEMORY DEVICE

CROSS REFERENCE TO RELATED APPLICATIONS

This application is a continuation application, which is based on and claims priority to U.S. Utility patent application Ser. No. 10/055,299, filed on Jan. 23, 2002 now U.S. Pat. No. 6,650,562, and which is incorporated herein in its entirety.

BACKGROUND OF THE INVENTION

1. Field of the Invention

The invention relates generally to magnetic tunnel junction (MTJ) memory devices, and, more particularly, to a system and method for determining the logic state of a memory cell in an MTJ memory device.

2. Related Art

A typical magnetic tunnel junction (MTJ) memory device includes an array of memory cells. Each of the cells is typically constructed of two layers of magnetic film, separated by a dielectric layer. The magnetization of one of the layers is alterable and the magnetization of the other layer is fixed or "pinned" in a particular direction. The magnetic film layer having alterable magnetization is typically referred to as a "data storage layer" and the magnetic film layer which is pinned is typically referred to as a "reference layer."

Conductive traces are typically routed across the array of memory cells. These conductive traces are typically arranged in rows and columns. The conductive traces extending along the rows of the memory cells are generally referred to as "word lines" and the conductive traces extending along the columns of the memory cells are generally referred to as "bit lines." The word lines and bit lines are typically oriented perpendicular to each other. Located at each intersection of a word line and a bit line, each memory cell stores the bit of information as an orientation of a magnetization.

Typically, the orientation of magnetization in the data storage layer aligns along an axis of the data storage layer that is commonly referred to as its "easy axis." Typically, external magnetic fields are applied to flip the orientation of magnetization in the data storage layer along its easy axis to either a parallel or anti-parallel orientation with respect to the orientation of magnetization in the reference layer, depending on the desired logic state.

The orientation of magnetization of each memory cell will assume one of two stable orientations at any given time. These two stable orientations, parallel and anti-parallel, represent logical values of "1" and "0", respectively. The orientation of magnetization of a selected memory cell may be changed by supplying current to a word line and a bit line crossing at the location of the selected memory cell. The currents create magnetic fields that, when combined, can switch the orientation of magnetization of the selected memory cell from parallel to anti-parallel or vice versa.

A selected magnetic memory cell is usually written by applying electrical currents to the particular word and bit lines that intersect at the selected magnetic memory cell. Typically, an electrical current applied to the particular bit line generates a magnetic field substantially aligned along the easy axis of the selected magnetic memory cell. The magnetic field aligned to the easy axis is generally referred to as a "longitudinal write field." An electrical current applied to the particular word line typically generates a magnetic field substantially perpendicular to the easy axis of the selected magnetic memory cell.

Typically, only one selected magnetic memory cell receives both the longitudinal and the perpendicular write fields at any one time. Non-selected memory cells that are coupled to the same word line as the selected cell generally receive only the perpendicular write field. Non-selected memory cells that are coupled to the same bit line as the selected cell generally receive only the longitudinal write field.

Because the word lines and the bit lines operate in combination to switch the orientation of magnetization of the selected memory cell (i.e., to write the memory cell), the word lines and bit lines are generally referred to collectively as "write lines." The write lines can also be used to read the logic values stored in the memory cell.

FIG. 1 is a plan view illustration of a simplified magnetic random access memory (MRAM) array, which is an exemplar MTJ memory device. The array 100 includes memory cells 120, word lines 130, and bit lines 132. The word lines 130 and bit lines 132 are referred to collectively as "write lines." The memory cells 120 are positioned at each intersection of a word line 130 and a bit line 132. Typically, the word lines 130 and bit lines 132 are arranged in orthogonal relation to one another and the memory cells 120 are positioned between the bit lines 132 and the word lines 130.

FIGS. 2A, 2B and 2C collectively illustrate the storage of a bit of data in a single memory cell 120 of the MRAM array of FIG. 1. As illustrated in FIG. 2A, the memory cell 120 includes an active magnetic data film 122 and a pinned magnetic film 124 which are separated by a dielectric region 126. The orientation of magnetization in the active magnetic data film 122 is not fixed and can assume two stable orientations, as shown by arrow M1. In contrast, the pinned magnetic film 124 has a fixed orientation of magnetization, as shown by arrow M2. The active magnetic data film 122 rotates its orientation of magnetization in response to electrical currents applied to the write lines (i.e., the word lines 130 and bit lines 132 of FIG. 1) during a write operation to the memory cell 120. The first logic state of the data bit stored in memory cell 120 is indicated when M1 and M2 are parallel to each other, as illustrated in FIG. 2B. When M1 and M2 are parallel, a logic "1" state is stored in the memory cell 120. Conversely, a second logic state is indicated when M1 and M2 are anti-parallel to each other, as illustrated in FIG. 2C. When M1 and M2 are anti-parallel, a logic "0" state is stored in the memory cell 120. In FIGS. 2B and 2C, the dialectic region 126 has been omitted. Although FIGS. 2A, 2B and 2C collectively illustrate the active magnetic data film 122 positioned above the pinned magnetic film 124, the pinned magnetic film 124 alternatively may be positioned above the active magnetic data film 122.

The resistance of the memory cell 120 differs according to the orientations of M1 and M2. When M1 and M2 are anti-parallel (i.e., the logic "0" state), the resistance of the memory cell 120 is at its highest. On the other hand, the resistance of the memory cell 120 is at its lowest when the orientations of M1 and M2 are parallel (i.e., the logic "1" state). As a consequence, the logic state of the data bit stored in the memory cell 120 can be determined by measuring the current flowing through memory cell 120.

FIG. 3 is a simplified illustration of an MTJ array 100 having a sensing circuit 150 for measuring the sense current flowing through one cell of the array 100. The array 100 is comprised of a plurality of word lines 130 and a plurality of bit lines 132. As described with respect to FIG. 1, a memory cell 120 is formed at each intersection of a word line 130 and a bit line 132 (for simplicity only the cells on the top row are numbered, but it should be understood that a cell is formed at each intersection of word lines 130 and bit lines 132). The particular cell for which the sense current is to be measured is denoted as cell 120a. A bias voltage ($V_a$) is applied to each of the bit lines 132 of MTJ array 100. The same bias voltage ($V_a$) is also applied to each of the word lines 130 of MTJ array 100, with the exception of the word line that intersects cell 120a, which for clarity is denoted as word line 130a. For a symmetric array having N word lines 130 and N bit lines 132, bias voltage $V_a$ would be applied to all N of the bit lines 132 and to N−1 of the word lines 130. A second bias voltage ($V_b$) is applied to the word line 130a that intersects cell 120a. Typically $V_a > V_b$ and in a typical implementation, $V_b$ is ground potential. Thus, the biasing voltage for each of the cells 120 in the array 100, with the exception of cell 120a is zero ($V_a - V_a$). The biasing voltage for cell 120a is ($V_a - V_b$), which results in a sense current ($I_{sc}$) flowing through cell 120a. Sensing circuit 150 is coupled to cell 120a by connections 151 and 152. Sensing circuit 150 measures the sense current ($I_{sc}$) that flows through cell 120a as a result of the applied bias voltage ($V_a - V_b$). The resistance (R) of the memory cell 120a at the applied bias voltage ($V_a - V_b$) is calculated by dividing the applied bias voltage ($V_a - V_b$) by the sense current ($I_{sc}$).

The logic state of a cell in an MTJ array, such as cell 120a of FIG. 3, typically has been determined by comparing the resistance of the cell at an applied bias voltage with predetermined resistance values corresponding to the logic "1" state and the logic "0" state. However, because MTJ memory devices operate on the principle of the quantum mechanical tunnel effect, the magnitude of the sense current in a particular cell, and hence the resistance of the cell, is very highly dependent on the thickness of the dielectric layer. Because variations in dielectric thickness within an array of MTJ devices cannot be completely eliminated by current thin film process techniques, these variations can cause seemingly disproportionate variations in the magnitude of the sense current that is measured within different cells in the array. This can lead to ambiguity in determining the logic state of different cells within an array. The practical implications of this ambiguity are such that, when operating an MTJ memory device array, a large number of errors potentially may occur during the process of retrieving data if the data state of any one cell is determined by comparing that cell's resistance to some pre-determined threshold value. This occurs because the difference in resistance between cells having the same stored logic state can easily exceed the difference in resistance of one cell as its logic state is switched from a "1" to a "0".

One way to overcome this ambiguity is to employ a data retrieval process known as a destructive read. A destructive read typically involves the following steps: (1) measuring the magnitude of sense current in a cell a first time in response to an applied voltage; (2) writing the cell to a known (previously determined) state (i.e., to a "1" or a "0"); (3) measuring the magnitude of the sense current in the cell a second time in response to a second application of the same applied voltage previously applied in step 1; and (4) determining whether the logic state of the bit in question was originally a "1" or a "0" based on the difference of the magnitude of the sense current between the first measurement and the second measurement. In addition, if the original state of the cell, as determined in step 4, is different from the state to which the cell was written during step 2, the cell must be returned to its original state by another write operation. For example, if the cell was written to a "1" during step 2, and the determination in step 4 indicated that the cell was originally a "0", the cell must be written back to its original "0" state after the destructive read is completed. On the other hand, if the cell was written to a "1" during step 2, and the determination in step 4 indicated that the cell was originally a "1", it would be not be necessary to perform a re-write operation to return the cell to its original state.

Although a destructive read process can be used to determine the state of a cell, this process has several significant shortcomings. Because the destructive read process requires that the cell be written to a known value and then, in some cases, written back to its original value, the destructive read process markedly increases read access time. The additional write operations also increase power consumption and may decrease the life expectancy of the cell.

The destructive read process also tends to exacerbate an undesirable condition known as half-select switching. Half-select switching may occur in an MTJ memory array having N×M cells, where N and M are greater than 1, when a write operation directed at one cell inadvertently causes an undesired change of state in another cell in the array. Ideally, a cell in an MTJ memory array will switch its logic state only when subjected to both longitudinal and perpendicular write fields, and will not switch its logic state when subjected only to either the longitudinal write field or the perpendicular write field, but not both. Thus, the magnitudes of the longitudinal and the perpendicular write fields should be sufficiently high so that the cells in the array switch their logic states only when subjected to both the longitudinal write field and the perpendicular write field. At the same time, the magnitudes of the longitudinal and the perpendicular write fields should be sufficiently low so that the cells in the array do not switch their logic states when subjected only to either the longitudinal write field or the perpendicular write field, but not both. However, in some cases a cell in the array may change its state even though it is only subjected to either the longitudinal write field or the perpendicular write field, but not both. This undesirable switching of a magnetic memory cell that receives only the longitudinal or the perpendicular write field is commonly referred to as half-select switching.

Half-select switching can, if present, cause catastrophic errors when operating an MTJ memory array. For example, an attempt to switch the logic state of a first cell in an array from "0" to "1" may have the inadvertent and undesired effect of erroneously changing the logic state of a second cell in the array from "0" to "1" as well. Although the problem of half-select switching may be mitigated by magnetic process engineering improvements, it is unlikely to be totally eliminated. Therefore, in order to minimize the potential for half-select switching, it is preferable to keep the number of write operations to a minimum. However, the destructive read process requires at least one extra write operation for each cell being read, and potentially two extra write operations if the cell must be re-written to its original state. Therefore, the destructive read process increases the likelihood that half-select switching will occur.

Therefore, there is a need for a system and method for determining the logic state of a cell in a magnetic tunnel junction (MTJ) memory device that overcomes the deficiencies and inadequacies stated above.

SUMMARY

The invention is a system and method for determining the logic state of a memory cell in a magnetic tunnel junction (MTJ) memory device based on the ratio of the current flowing through the device in response to at least two different bias voltages. The system comprises a biasing circuit or voltage supply for applying at least two different bias voltages to a memory cell in an MJT memory device, a sensing circuit or current measuring device for measuring the current flowing through the memory cell at each applied bias voltage, and a processing element configured to compute the ratio of the currents measured at each applied bias voltage and to compare the ratio of the currents measured at each applied bias voltage with a predetermined value.

The invention may also be characterized as a method comprising the steps of applying a first bias voltage to a memory cell in an MTJ memory device, measuring the current flowing through the cell at the first bias voltage, applying a second bias voltage to the cell, the second bias voltage being different from the first bias voltage, measuring the current flowing through the cell at the second bias voltage, determining the ratio of the current flowing through the cell at the first bias voltage with the current flowing through the cell at the second bias voltage, and comparing the determined ratio to a predetermined value.

Other features and advantages of the present invention will become apparent to one with skill in the art upon examination of the following drawings and detailed description. It is intended that all such features and advantages be included herein within the scope of the present invention, as defined in the appended claims.

BRIEF DESCRIPTION OF THE DRAWINGS

The present invention, as defined in the claims, can be better understood with reference to the following drawings. The components within the drawings are not necessarily to scale relative to each other, emphasis instead being placed upon clearly illustrating the principles of the present invention.

DETAILED DESCRIPTION OF THE INVENTION

In the following detailed description of the invention, reference is made to the accompanying drawings which form a part hereof, and in which are shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims. For example, although described below as applied to a magnetic random access memory (MRAM) array, the invention is generally applicable to any device that uses an MTJ memory cell as a storage element, including but not limited to MRAMs, EEPROMS, flip-flops, shift-registers, etc.

Figure 4:
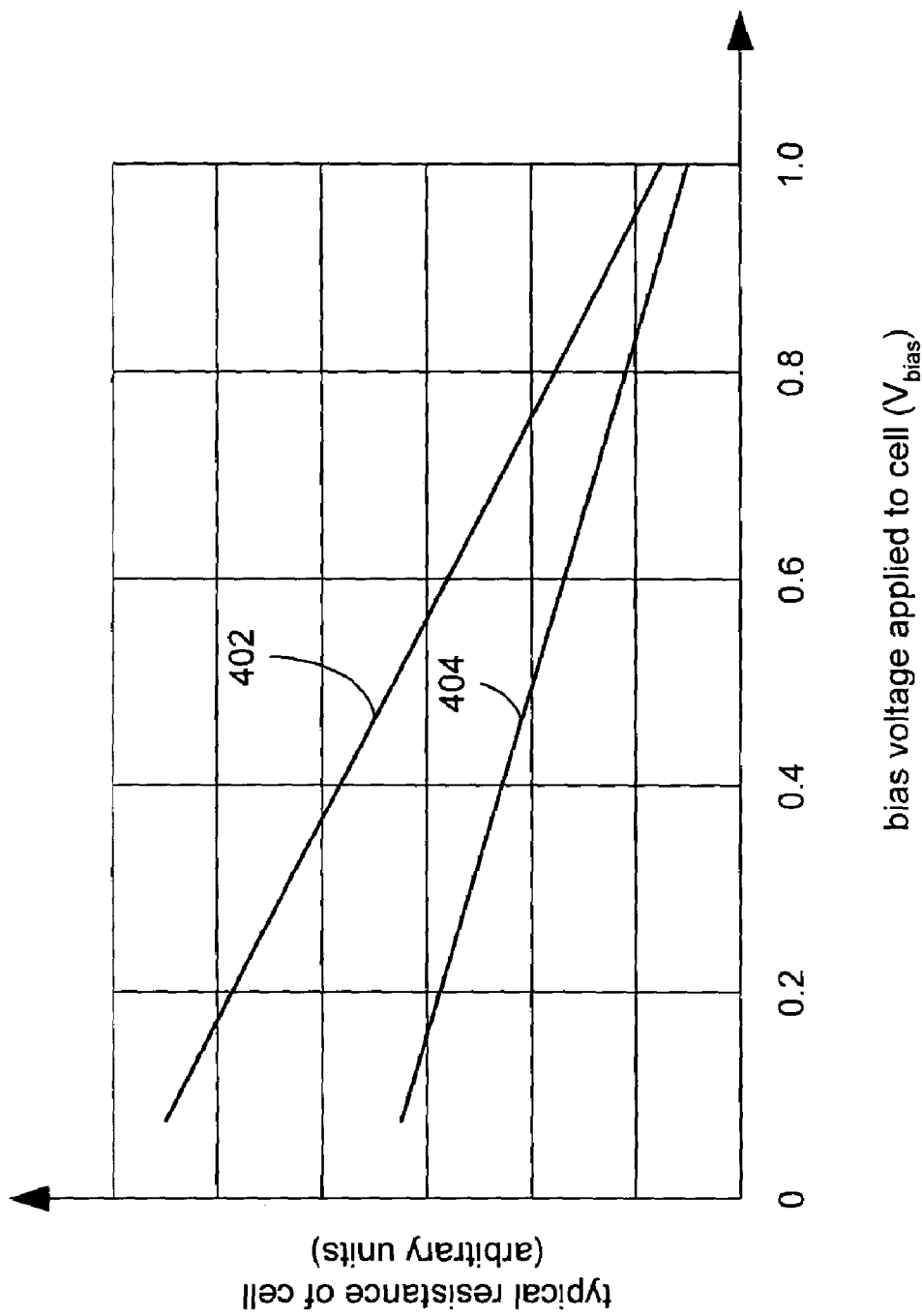
FIG. 4 is a graphical illustration of the typical resistance values of an MTJ memory device measured as a function of applied bias voltage for parallel and anti-parallel orientations of the magnetic storage layer with respect to the pinned layer.

Referring now to the figures, wherein like reference numerals indicate corresponding components throughout the several views, FIG. 4 is a graphical illustration of the typical resistance values of a typical MTJ memory cell measured as a function of applied bias voltage for parallel ($R_p$) and anti-parallel ($R_{ap}$) orientations of the magnetic storage layer with respect to the pinned layer. This data is typical for a Ferromagnet-Insulator-Ferromagnet (FM-I-FM) MTJ device. Curve 402 illustrates the resistance of the cell in the anti-parallel state as a function of the applied bias voltage ($V_{bias}$). Curve 404 illustrates the resistance of the cell in the parallel state as a function of the applied bias voltage ($V_{bias}$). The curves 402, 404 of FIG. 4 illustrate that the resistance of the cell in the anti-parallel state is greater than the resistance of the cell in the parallel state for each applied bias voltage, and the amount by which the resistance in the anti-parallel state differs from the resistance in the parallel state is dependent on the magnitude of the applied bias voltage (i.e., the difference in resistance between the anti-parallel and parallel states decreases as the applied bias voltage is increased).

As illustrated in FIG. 4, the gradient of the resistance versus applied bias curve in the anti-parallel state (curve 402) is considerably larger than in the parallel state (curve 404). As is known to persons having skill in the art, this is a consistent trait of MTJ devices that is typically quantified by determining a device's tunneling magneto resistance ratio (TMR), as discussed below with reference to FIG. 5.

Figure 5:
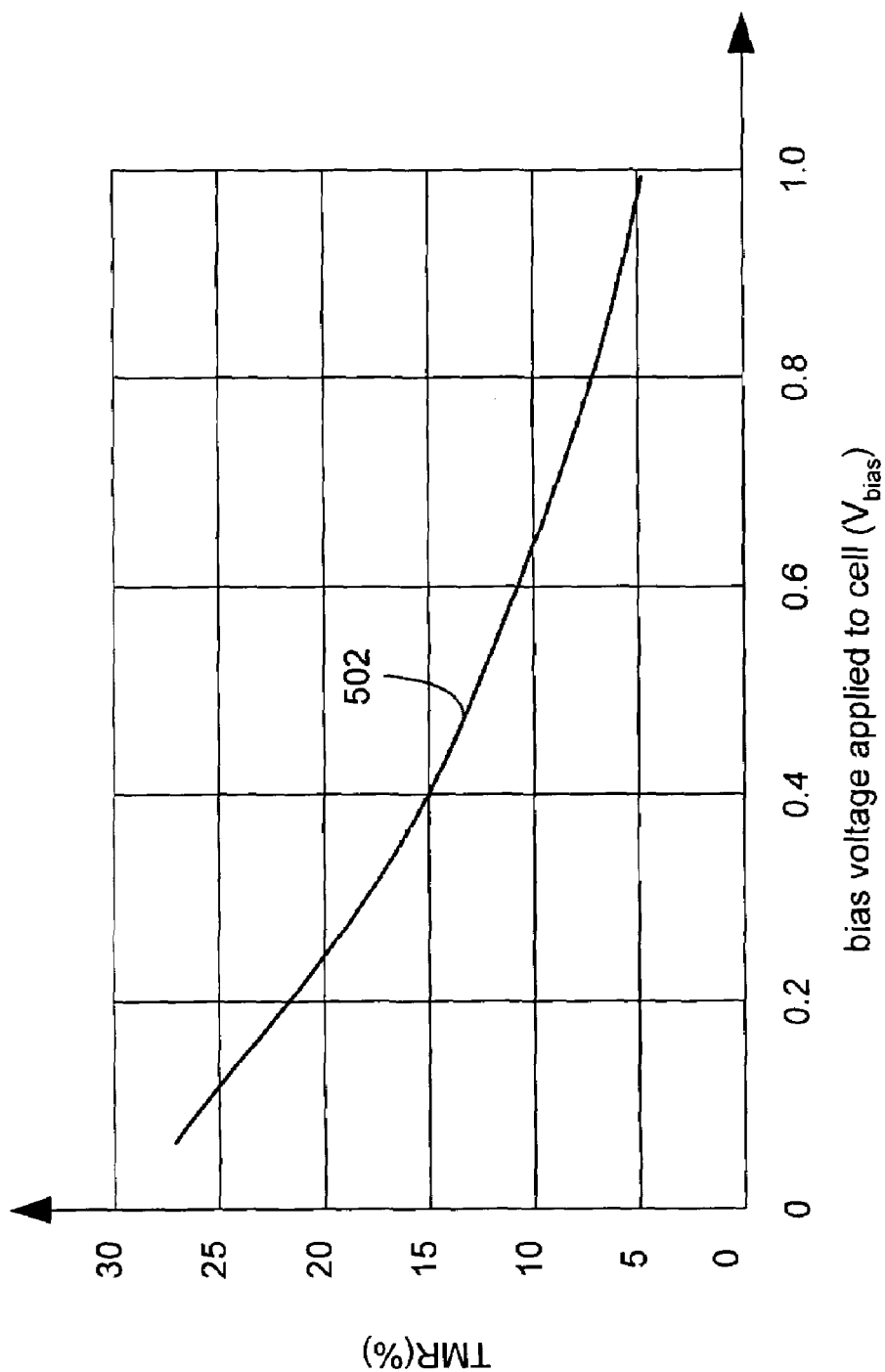
FIG. 5 is a graphical illustration of the tunneling magneto resistance ratio (TMR) of the resistance values of FIG. 4.

FIG. 5 is a graphical illustration of the tunneling magneto resistance ratio (TMR) of the resistance values of FIG. 4 as a function of the applied voltage bias ($V_{bias}$). The TMR is computed by dividing the difference between the anti-parallel resistance and the parallel resistance ($R_{ap}-R_p$) by the parallel resistance ($R_p$) at each bias point. Thus, TMR= ($R_{ap}-R_p$)/$R_p$. As illustrated by curve 502, the TMR of an MTJ device decreases as the voltage bias increases. Typically, such a device would be operated at a read bias point having a TMR of ~20–25%. However, this value could be increased by operating the device at a lower applied bias. Conversely, if it were necessary to operate the device at a higher applied bias, this value would be reduced. This latter point is typically viewed as a disadvantage of MTJ devices and has generally limited the magnitude of the upper bias point at which such devices have been operated. This limitation is due to the fact that the difference between the anti-parallel resistance and the parallel resistance at the higher bias voltages is so small that it is very difficult to determine the state of the device at such voltages using conventional techniques.

The fact that the TMR ratio decreases as applied bias increases (as illustrated in FIG. 5) has typically been viewed as an adverse characteristic of MTJ devices. Consequently, much effort has been to reduce the sensitivity of the TMR ratio to the applied bias. However, it has been shown theoretically that such sensitivity is a fundamental property of FM-I-FM MTJ devices, so the expectation of eliminating this sensitivity appears low. As described below, the present invention exploits this characteristic to determine the state of an MTJ memory device.

Figure 6:
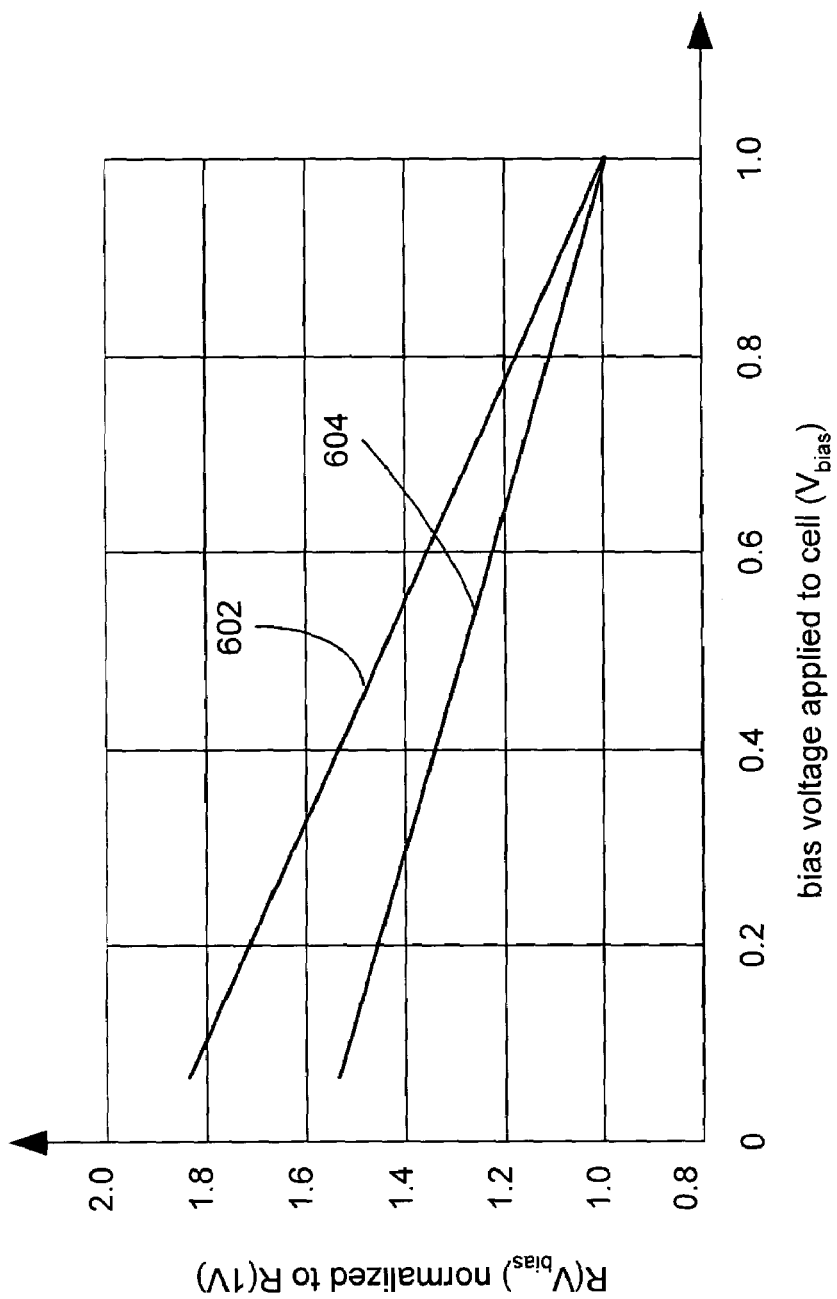
FIG. 6 is a graphical illustration of the resistance values of FIG. 4 normalized to the value of resistance measured for each state at a particular reference voltage.

FIG. 6 is a graphical illustration of the resistance values of FIG. 4 normalized to the value of resistance measured for each state at a particular reference voltage. FIG. 6 is derived from the same raw data used to construct FIGS. 4 and 5. In FIG. 6 the resistance data has been normalized, for each state, to the value of resistance that the MTJ device would have had, in that state, at an applied bias of 1V. Although 1V was chosen for the example of FIG. 6, the data may be normalized to the resistance at any suitable applied voltage. Normalizing the data for each cell to the value for that cell at a particular reference voltage minimizes the variations between cells in the array. In other words, while there may be a significant degree of variation between the absolute resistance values for different cells in an array, the normalized values will typically be much more consistent.

With reference to FIG. 6, curve 602 represents the ratio of the resistance of the cell in the anti-parallel state for each applied bias voltage to the resistance of the cell in the anti-parallel state at an applied bias voltage of 1V. Curve 604 represents the ratio of the resistance of the cell in the parallel state for each applied bias voltage to the resistance of the cell in the parallel state at an applied bias voltage of 1V. As illustrated in FIG. 6, the slope of curve 602 (representing the anti-parallel state) is steeper than the slope of curve 604 (representing the parallel state).

Figure 1:
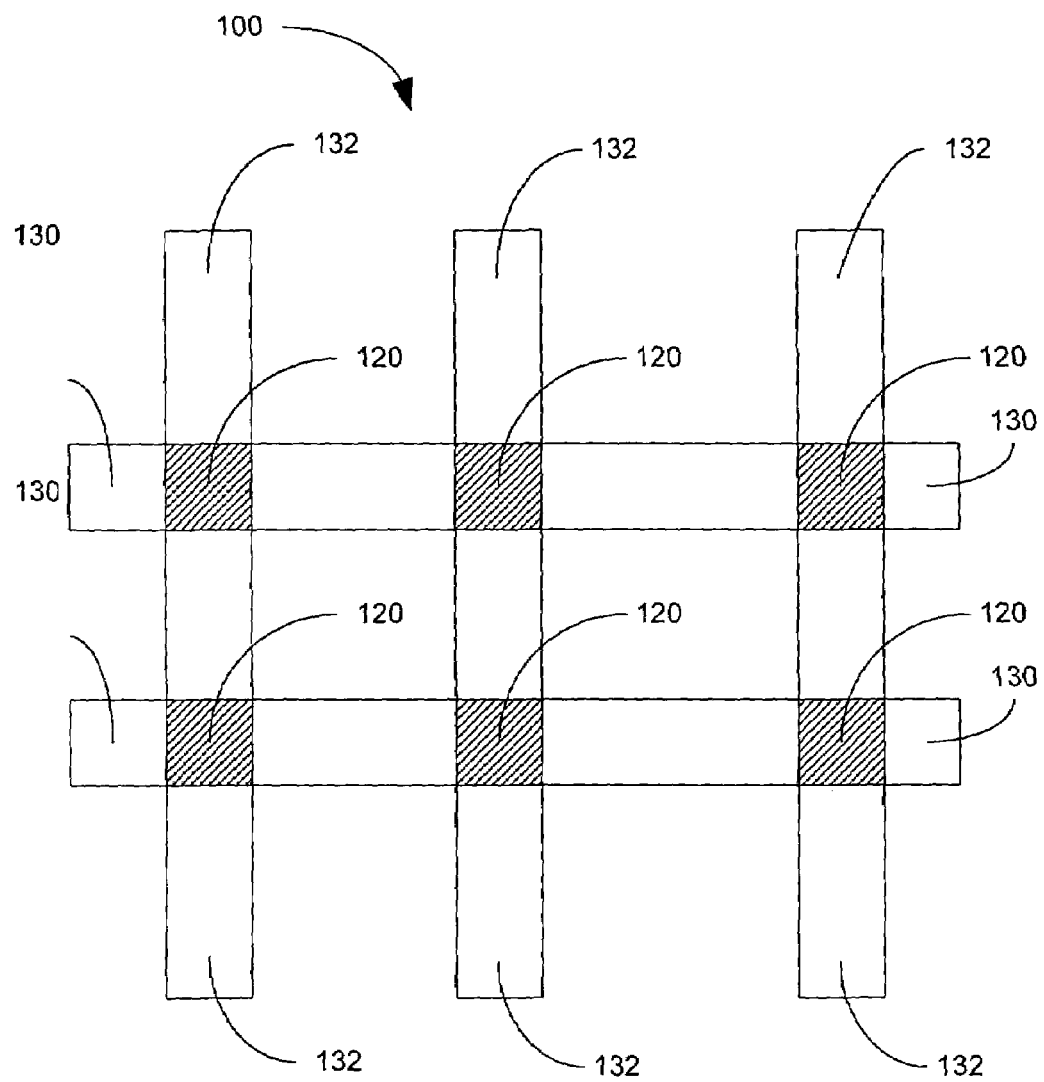
FIG. 1 is a plan view illustration of a simplified magnetic random access memory (MRAM) array, which is an exemplary MTJ memory device, which may be read by an embodiment of the system and method of the present invention.
Figure 2A:
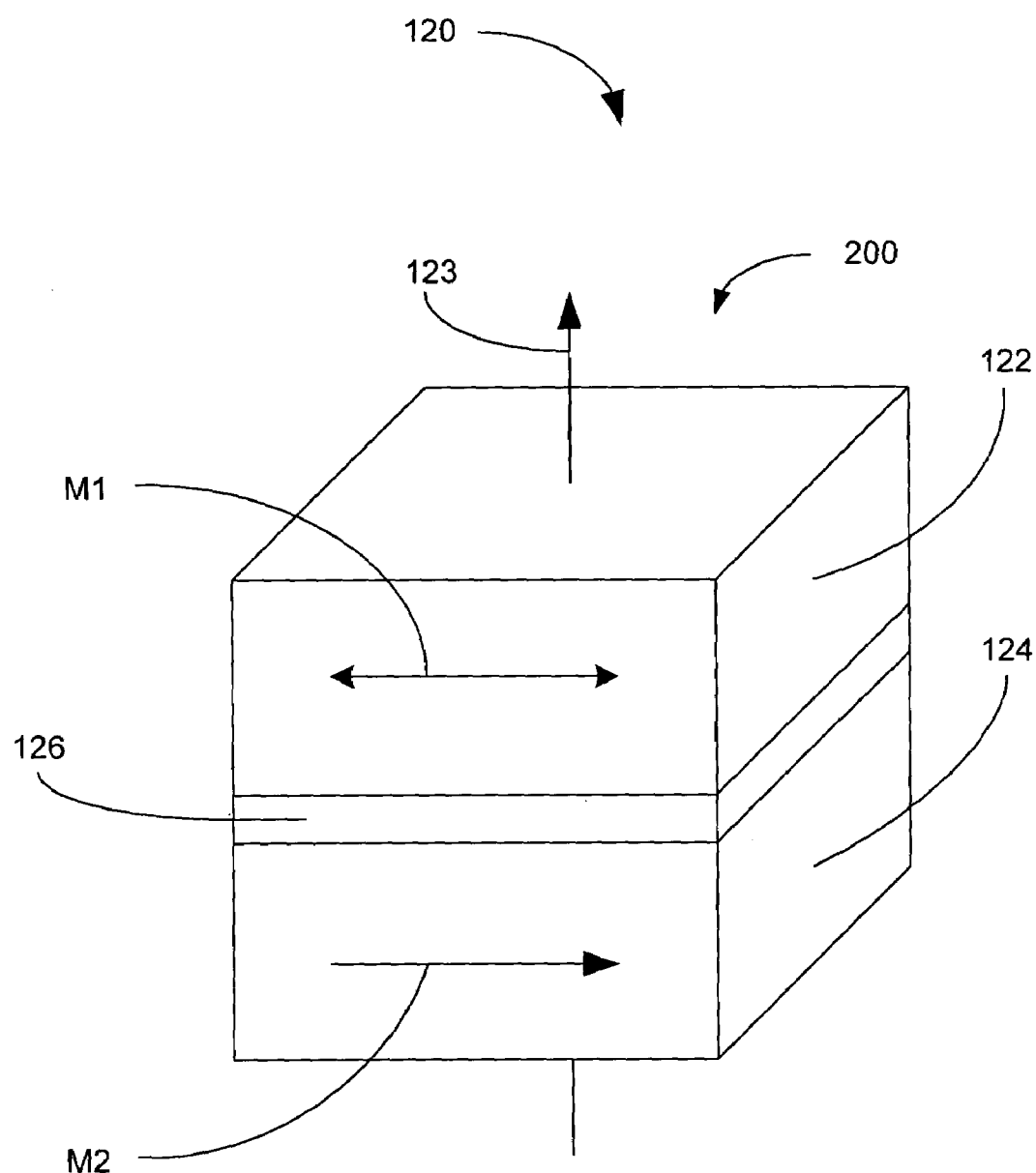
FIG. 2A is an illustration of the storage of a bit of data in a single memory cell of the MRAM array of FIG. 1.
Figures 2B, 2C:
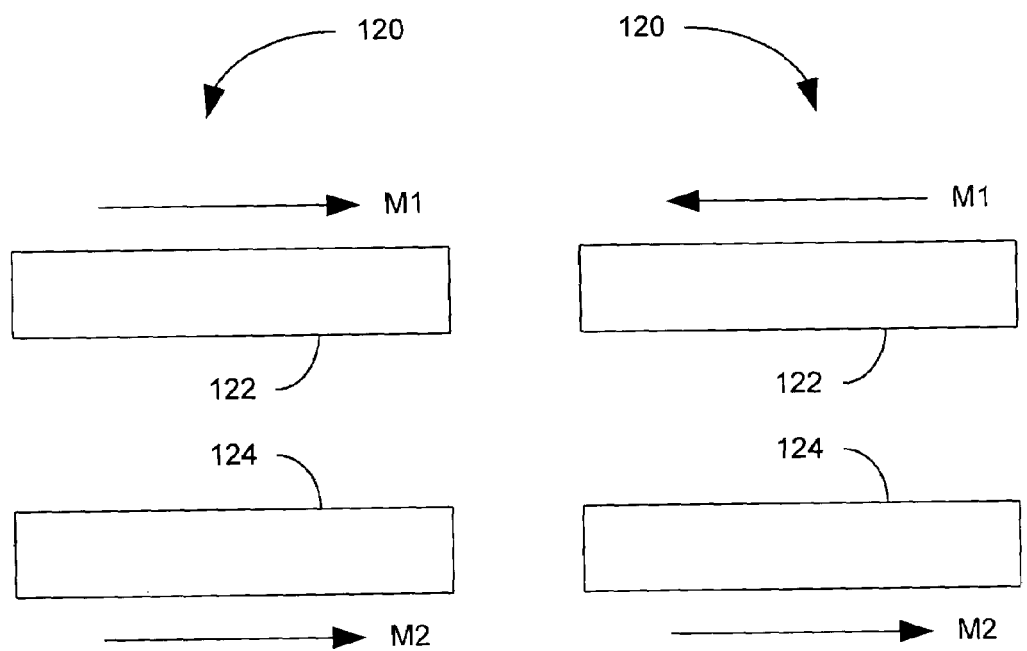
FIG. 2B is an illustration of a logic state "1" for the data bit stored in the memory cell of FIG. 2A.
FIG. 2C is an illustration of a logic state "0" for the data bit stored in the memory cell of FIG. 2A.
Figure 3:
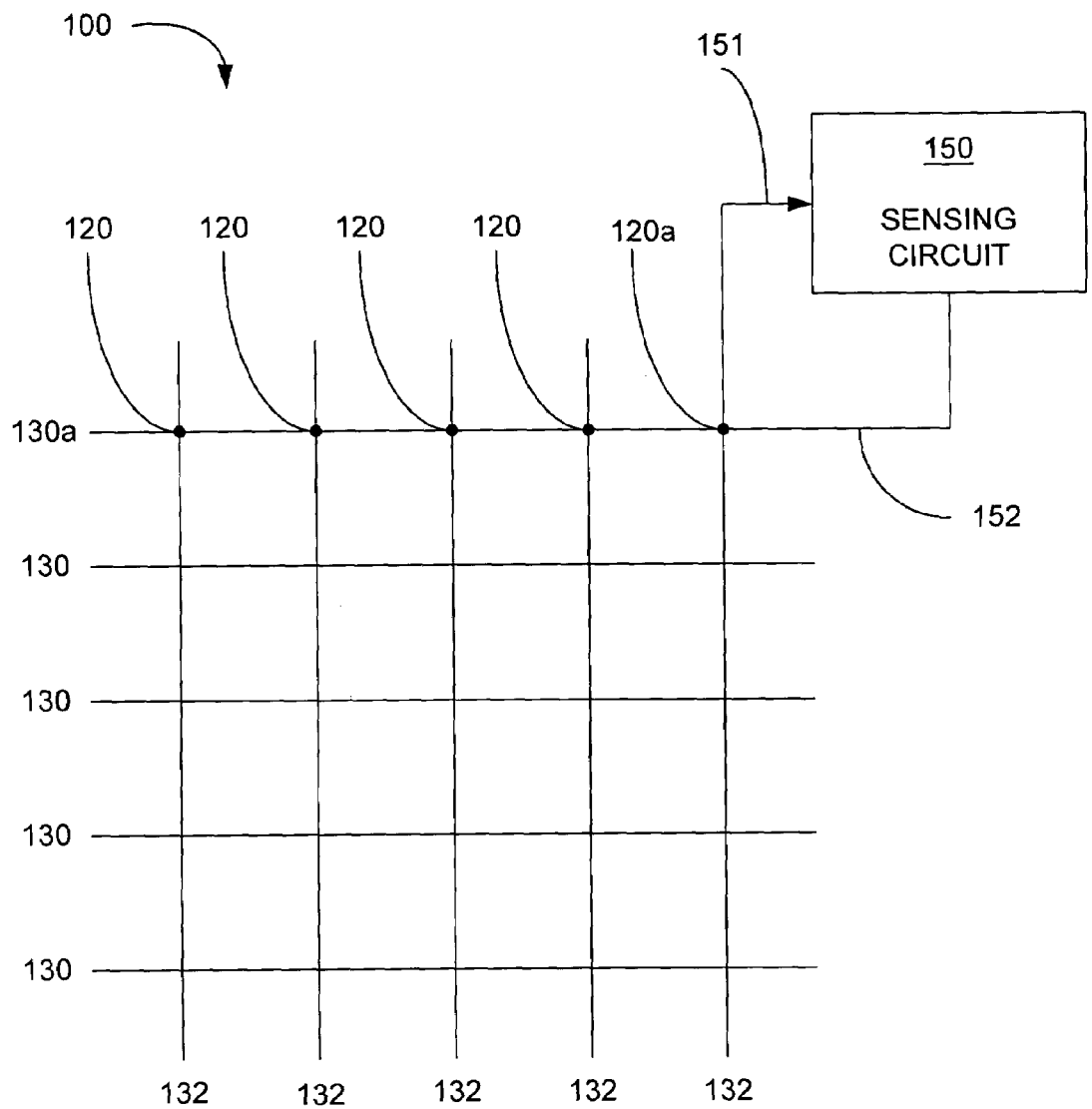
FIG. 3 is a simplified illustration of an MTJ array having a sensing circuit for measuring the sense current flowing through one cell of the array.

Rather than using a single resistance measurement to determine the logic state of a memory cell in an MTJ memory array, as described above with respect to FIG. 3, the system and method of the present invention utilizes at least two measurements to determine the rate of change of the cell's resistance as a function of the applied voltage to more accurately determine the logic state of the memory cell, as described below with reference to FIGS. 7 and 8.

The system and method of the invention can be implemented in software (e.g., firmware), hardware, or a combination thereof. As a non-limiting example, the system may be implemented in a computer system, which includes software, as an executable program, that is executed by a special or general purpose processor, such as a processor in a personal computer (PC; IBM-compatible, Apple-compatible, or otherwise), workstation, minicomputer, or mainframe computer. An example of a general purpose computer that can implement the system and method of the present invention is shown in FIG. 7. In FIG. 7, the computer system is denoted by reference numeral 700.

Figure 7:
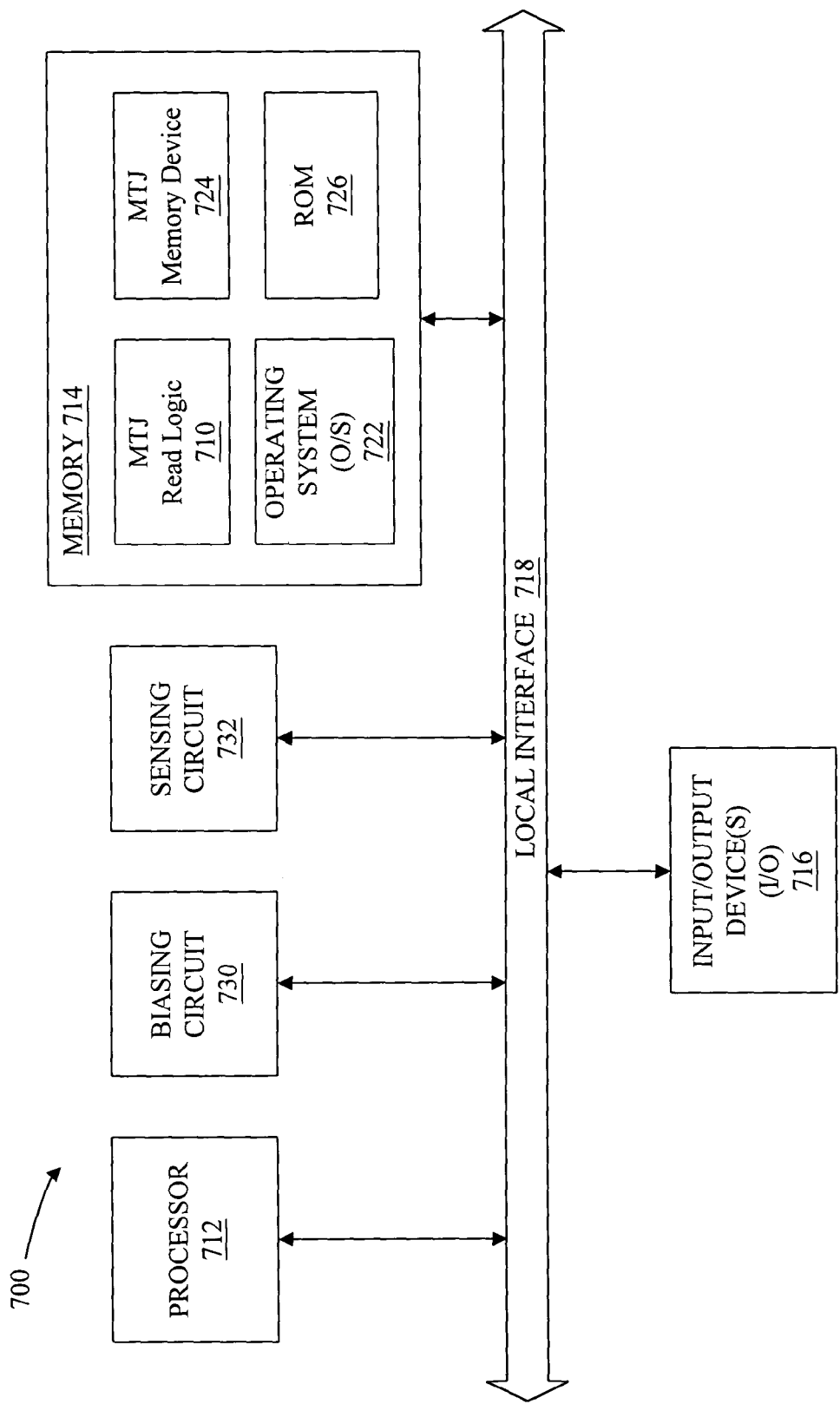
FIG. 7 is a simplified block diagram of a computer system which may be used to implement a system and method for determining the state of a memory cell in an MTJ memory device, such as an MRAM

Generally, in terms of hardware architecture, as shown in FIG. 7, the computer system 700 includes a processor 712, memory 714, biasing circuit 730, sensing circuit 732 and one or more input and/or output (I/O) devices 716 (or peripherals), all of which are communicatively coupled via a local interface 718. The local interface 718 can be, for example but not limited to, one or more buses or other wired or wireless connections, as is known in the art. The local interface 718 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 712 is a hardware device for executing software, particularly that stored in memory 714. The processor 712 can be any custom made or commercially available processor, a central processing unit (CPU), an auxiliary processor among several processors associated with the computer system 700, a semiconductor based microprocessor (in the form of a microchip or chip set), a macroprocessor, or generally any device for executing software instructions. Examples of suitable commercially available microprocessors are as follows: a PA-RISC series microprocessor from Hewlett-Packard Company, an 80×86 or Pentium series microprocessor from Intel Corporation, a PowerPC microprocessor from IBM, a Sparc microprocessor from Sun Microsystems, Inc, or a 68xxx series microprocessor from Motorola Corporation.

The memory 714 can include any one or a combination of volatile memory elements (e.g., random access memory (RAM, such as DRAM, SRAM, SDRAM, etc.)) and nonvolatile memory elements (e.g., magnetic random access memory (MRAM), ROM, hard drive, tape, CDROM, etc.). It should be noted that an MRAM is non-volatile while other types of RAM (i.e., DRAM, SRAM, SDRAM, etc.) are volatile. Thus, it may be advantageous to use a non-volatile MRAM rather than a volatile RAM in certain applications. This further emphasizes the need for a system and method which can accurately determine the logic state of an MRAM.

The memory 714 also may incorporate electronic, magnetic, optical, and/or other types of storage media. Note that the memory 714 can have a distributed architecture, where various components are situated remote from one another, but can be accessed by the processor 712. In the example of FIG. 7, the memory 714 includes an MTJ memory device 724, which may be an MRAM, and a separate ROM 726.

The software in memory 714 may include one or more separate programs, each of which comprises an ordered listing of executable instructions for implementing logical functions. In the example of FIG. 7, the software in the memory 714 includes MTJ read logic 710 and a suitable operating system (O/S) 722. A nonexhaustive list of examples of suitable commercially available operating systems 722 is as follows: (a) a Windows operating system available from Microsoft Corporation; (b) a Netware operating system available from Novell, Inc.; (c) a Macintosh operating system available from Apple Computer, Inc.; (e) a UNIX operating system, which is available for purchase from many vendors, such as the Hewlett-Packard Company, Sun Microsystems, Inc., and AT&T Corporation; (d) a LINUX operating system, which is freeware that is readily available on the Internet; (e) a run time Vxworks operating system from WindRiver Systems, Inc.; or (f) an appliance-based operating system, such as that implemented in handheld computers or personal data assistants (PDAs) (e.g., PalmOS available from Palm Computing, Inc., and Windows CE available from Microsoft Corporation). The operating system 722 essentially controls the execution of other computer programs, such as the MTJ read logic 710, and provides scheduling, input-output control, file and data management, memory management, and communication control and related services.

The MTJ read logic 710 can be a source program, executable program (object code), script, or any other entity comprising a set of instructions to be performed. When a source program, the program is typically translated via a compiler, assembler, interpreter, or the like, which may or may not be included within the memory 714, so as to operate properly in connection with the O/S 722. Furthermore, the MTJ read logic 710 can be written as (a) an object oriented programming language, which has classes of data and methods, or (b) a procedure programming language, which has routines, subroutines, and/or functions, for example but not limited to, C, C++, Pascal, Basic, Fortran, Cobol, Perl, Java, and Ada.

The I/O devices 716 may include input devices, for example but not limited to, a keyboard, mouse, scanner, microphone, etc. Furthermore, the I/O devices 716 may also include output devices, for example but not limited to, a printer, display, etc. Finally, the I/O devices 716 may further include devices that communicate both inputs and outputs, for instance but not limited to, a modulator/demodulator (modem—for accessing another device, system, or network), a radio frequency (RF) or other transceiver, a telephonic interface, a bridge, a router, etc.

If the computer system 700 is a PC, workstation, or the like, the software in the memory 714 may further include a basic input output system (BIOS) (omitted for simplicity). The BIOS is a set of essential software routines that initialize and test hardware at startup, start the O/S 22, and support the transfer of data among the hardware devices. The BIOS is stored in ROM so that the BIOS can be executed when the computer system 700 is activated.

When the computer system 700 is in operation, the processor 712 is configured to execute software stored within the memory 714, to communicate data to and from the memory 714, and to generally control operations of the computer system 700 pursuant to the software. The MTJ read logic 710 and the O/S 722, in whole or in part, but typically the latter, are read by the processor 712, perhaps buffered within the processor 712, and then executed.

When the MTJ read logic 710 is implemented in software, as is shown in FIG. 7, it should be noted that the MTJ read logic 710 can be stored on any computer readable medium for use by or in connection with any computer related system or method. In the context of this document, a computer readable medium is an electronic, magnetic, optical, or other physical device or means that can contain or store a computer program for use by or in connection with a computer related system or method. The MTJ read logic 710 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the system is implemented in hardware, the biasing circuit 730, the sensing circuit 732, and the MTJ read logic 710 can each be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. The biasing circuit 730 can even be a stand-alone voltage supply and the sensing circuit 732 an ammeter.

The exemplar system illustrated in FIG. 7 functions in the same way as described above with respect to FIG. 3 to apply bias voltages to individual cells in MTJ memory device 724 so that the current flowing through the cells can be measured. In one exemplar embodiment of FIG. 7, biasing circuit 730 applies a first bias voltage $V_a$ to each of the bit lines 132 of MTJ memory device 724, which in this example is an MRAM array 100. Biasing circuit 730 also applies the same bias voltage $V_a$ to each of the word lines 130 of MTJ memory device 724, with the exception of the word line 130a that intersects the cell being accessed (e.g., for a symmetric array having N word lines 130 and N bit lines 132, bias voltage $V_a$ would be applied to all N of the bit lines and to N−1 of the word lines). The biasing circuit 730 applies a second bias voltage $V_b$ to the word line 130a that intersects the cell being accessed.

In another exemplar embodiment of FIG. 7, biasing circuit 730 can be used to provide a first bias voltage to all N of the word lines 130 and to N−1 of the bit lines 132, and a second bias voltage to the bit line 132 that intersects the cell being accessed.

In either of these embodiments, typically $V_a > V_b$ and in a typical implementation, $V_b$ is ground potential, although other suitable voltages can be used. Thus, the biasing voltage for each of the cells in the array 100, with the exception of the cell being accessed, is zero ($V_a - V_a$). The biasing voltage for the cell being accessed is ($V_a - V_b$), which results in a sense current ($I_{sc}$) flowing through the cell being accessed. Sensing circuit 732 is used to monitor the sense current ($I_{sc}$) that flows through the cell being accessed as a result of the applied bias voltage ($V_a - V_b$).

Figure 8:
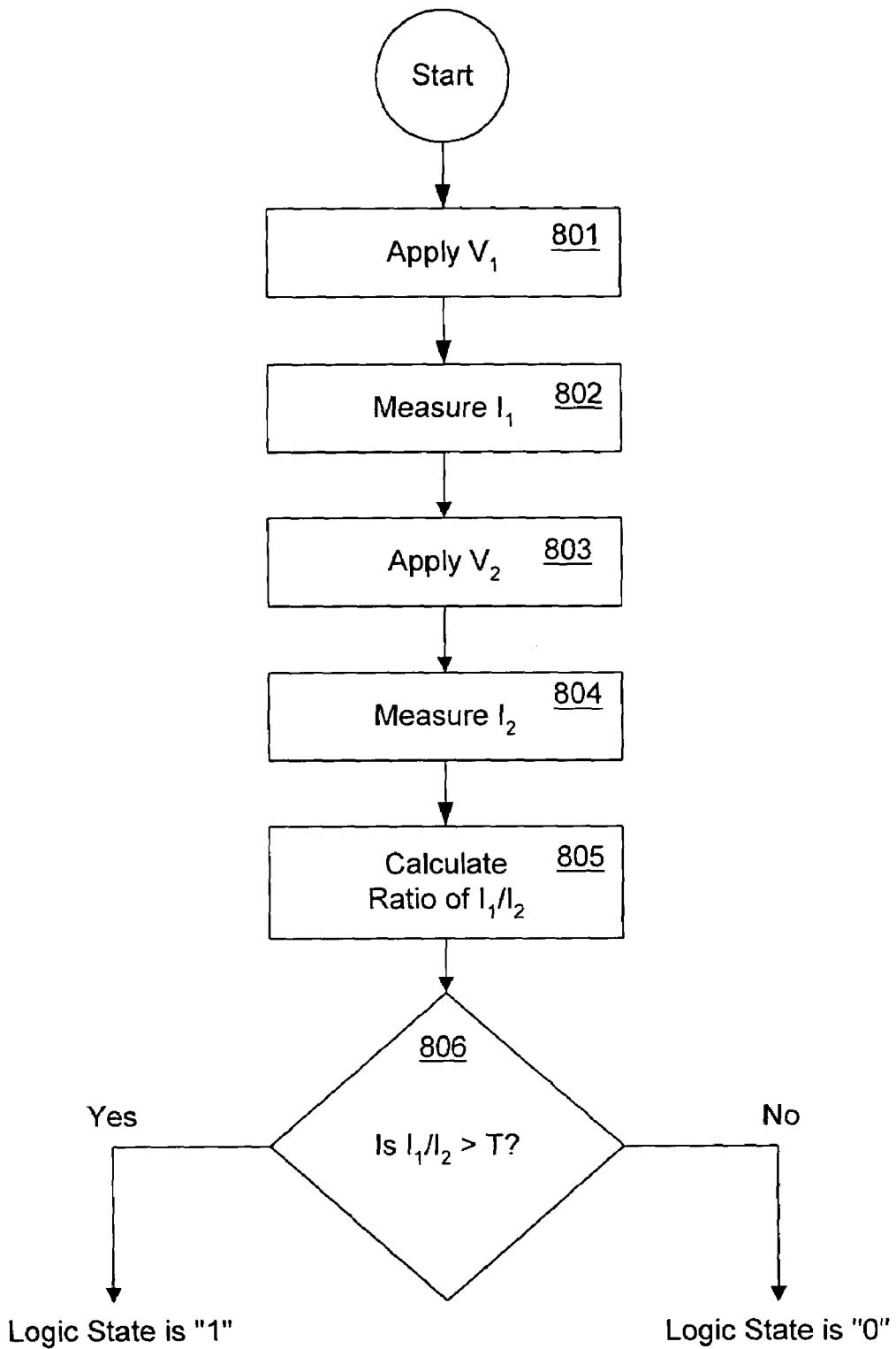
FIG. 8 is an exemplary flowchart illustrating the steps of the logic of FIG. 7.

FIG. 8 is a flowchart of the logic implemented by MTJ read logic 710 of FIG. 7 to determine the state of a cell in MTJ memory device 724. In step 801, a first bias voltage ($V_{a1} - V_{b1} = V_1$) is applied to the cell by biasing circuit 730, as described above with respect to FIG. 7 (e.g., $V_{a1}$ is applied to the bit line 132 that intersects the cell being accessed and $V_{b1}$ is applied to the word line 130a that intersects the cell being accessed). In step 802, the current ($I_1$) that flows through the cell as the result of the first bias voltage ($V_1$) is measured by sensing circuit 732. In step 803, a second bias voltage ($V_{a2} - V_{b2} = V_2$) is applied to the cell by biasing circuit 730, as described above with respect to FIG.

7 (e.g., $V_{a2}$ is applied to the bit line 132 that intersects the cell being accessed and $V_{b2}$ is applied to the word line 130a that intersects the cell being accessed). Typically, $V_2$ will be on the order of $V_1/3$. However, this is not a critical limitation, and other values for $V_2$ may be used so long as $V_2$ is different from $V_1$. In step 804, the current ($I_2$) that flows through the cell as the result of the second bias voltage ($V_2$) is measured by sensing circuit 732. In step 805, the ratio of the current ($I_1$) flowing through the device as a result of the first bias voltage ($V_1$) to the current flowing through the device as a result of the second bias voltage ($V_2$) is determined by the equation $I_1/I_2$. Finally, in step 806, the ratio computed in step 805 is compared to a predetermined threshold (T), which is stored in ROM 726 (of FIG. 7). If the ratio ($I_1/I_2$) is higher than the threshold (T), the cell is determined to be in the anti-parallel state (i.e., a logic "0"). If the ratio is less than the threshold (T), the cell is determined to be in the parallel state (i.e., logic "1").

By relying on the slope of the resistance curve between two bias points rather than an absolute resistance measurement, this measurement technique is less sensitive to increases in the bias voltage than other techniques. Thus, the present technique can be operated with an adequate signal to noise ratio at higher bias voltages than other techniques, which are limited by the large reduction in TMR as the voltage bias increases, and the consequent degradation of the signal to noise ratio.

The measurement technique described above also does not require a destructive read. It may therefore operate faster while consuming less power and generating fewer half-select errors than other systems and methods for determining the state of an MTJ device. In addition, the invention is compatible with the natural variations that occur during the production of an MRAM array, which may lead to large variations in resistance among the various cells in an array. Because the invention uses normalized characteristics, as illustrated in FIG. 6, the variations between cells are minimized. This allows for a non-destructive threshold based technique to be used. Additionally, the requirement that a predetermined threshold (T) be stored in a separate non-volatile memory (e.g., ROM 726 of FIG. 7) can be eliminated by computing a dynamic threshold (T) based on a set of reference cells within the array, some of which are always left in the parallel configuration and others of which are always left in the anti-parallel configuration. The threshold (T) could be derived dynamically by performing steps 801 through 805 of FIG. 8 on the reference cells, and then using the ratio computed for the reference cells in step 805 as the threshold value when steps 801 through 806 are performed with respect to the selected cells. This would have the advantage that operating conditions would be automatically compensated for as would other unrelated process variables that would affect the reference cells and data cells given that they would be fabricated simultaneously.

It will be apparent to those skilled in the art that many modifications and variations may be made to the preferred embodiments of the present invention, as set forth above, without departing substantially from the principles of the present invention. For example, although the exemplar embodiments described herein are directed to a two point derivative of the resistance versus bias curves (to show that in either state this derivative can be just as much a distinguishing factor between states as a measured difference in resistance between states at constant bias), an alternative embodiment could use a true derivative circuit in place of a simple sensing circuit to extract the information exemplified in FIG. 6 in order to determine the logic state of the cell in question. Other modifications and variations of the invention may be implemented in order to exploit the basic concept of using the gradient of resistance with respect to applied bias as a means of detecting the state of an MTJ device. All such modifications and variations are intended to be included herein within the scope of the present invention, as defined in the claims that follow.

What is claimed is:

1. A computer system comprising:
    a memory having a magnetic tunnel junction (MTJ) memory device, the MTJ memory device having a memory cell;
    a biasing circuit configured to supply at least two different biasing voltages to the cell;
    a sensing circuit configured to measure the current flowing through the cell at each of the at least two different biasing voltages; and
    a processing element configured to determine a ratio of the current flowing through the cell at a first one of the at least two different biasing voltages to the current flowing through the cell at a second one of the at least two different biasing voltages and to compare the ratio to a predetermined value.

2. The system of claim 1, wherein the biasing circuit, the sensing circuit, the processing element and the MTJ device are fabricated as an application specific integrated circuit (ASIC).

3. The system of claim 1, wherein the biasing circuit is a voltage supply.

4. The system of claim 1, wherein the sensing circuit is an ammeter.

5. The system of claim 1, further comprising a reference MTJ memory cell having a known state.

6. The system of claim 1, wherein the MTJ device is a magnetic random access memory (MRAM).

7. The system of claim 1, wherein the MRAM is an MRAM array.

8. The system claim 1, wherein the second bias voltage is less than the first bias voltage.

9. The system of claim 1, wherein the second bias voltage is more than the first bias voltage.

10. The system of claim 1, wherein the second bias voltage is on the order of ⅓ of the first bias voltage.

11. The system of claim 1, further comprising a processor operative to execute instructions stored in said memory.

12. A method for determining the logic state of a memory cell in a magnetic tunnel junction (MTJ) memory device, comprising:
    applying a first bias voltage to the cell;
    measuring a current flowing through the cell at the first bias voltage;
    applying a second bias voltage to the cell, the second bias voltage being different from the first bias voltage;
    measuring a current flowing through the cell at the second bias voltage;
    using the current flowing through the cell and measured at each of the first bias voltage and second bias voltage to determine the logic state of the cell.

13. The method of claim 12, wherein the second bias voltage is less than the first bias voltage.

14. The method of claim 12, wherein the second bias voltage is greater than the first bias voltage.

15. The method of claim 12, wherein the second bias voltage is on the order of ⅓ of the first bias voltage.

16. The method of claim 12, wherein the MTJ device is a magnetic random access memory (MRAM).

17. The method of claim 12, wherein the MRAM is an MRAM array.

* * * * *